(12) United States Patent
Choi et al.

(10) Patent No.: US 7,105,417 B2
(45) Date of Patent: Sep. 12, 2006

(54) METHOD FOR FABRICATING CAPACITOR OF SEMICONDUCTOR DEVICE

(75) Inventors: Ik-Soo Choi, Ichon-shi (KR); Byung-Jun Park, Ichon-shi (KR); Il-Young Kwon, Ichon-shi (KR)

(73) Assignee: Hynix Semiconductor Inc., Ichon-shi (KR)

( * ) Notice: Subject to any disclaimer, the term of this patent is extended or adjusted under 35 U.S.C. 154(b) by 48 days.

(21) Appl. No.: 10/615,291

(22) Filed: Jul. 9, 2003

(65) Prior Publication Data
US 2004/0115881 A1 Jun. 17, 2004

(30) Foreign Application Priority Data
Dec. 12, 2002 (KR) ............... 10-2002-0079188

(51) Int. Cl.
*H01L 21/20* (2006.01)
(52) U.S. Cl. .................... 438/393; 438/396
(58) Field of Classification Search ............ 438/3, 438/240, 381, 393, 396, 399
See application file for complete search history.

(56) References Cited

U.S. PATENT DOCUMENTS

| | | | |
|---|---|---|---|
| 6,320,213 B1* | 11/2001 | Kirlin et al. | 257/295 |
| 6,358,794 B1* | 3/2002 | Oh | 438/253 |
| 6,359,295 B1* | 3/2002 | Lee et al. | 257/295 |
| 6,642,100 B1* | 11/2003 | Yang et al. | 438/253 |
| 6,809,000 B1* | 10/2004 | Nakao et al. | 438/393 |
| 2001/0035550 A1* | 11/2001 | Yamazaki et al. | 257/306 |

FOREIGN PATENT DOCUMENTS

| | | | |
|---|---|---|---|
| EP | 000472135 A1 * | 2/1996 | |
| KR | 1999-25236 | 4/1999 | |
| KR | 2001-109725 | 12/2001 | |

OTHER PUBLICATIONS

Wolf et al. Silicon Processing for the VLSI Era, vol. 1- Process Technology, Second Edition, Lattice Press 2000, pp. 21 219.*

* cited by examiner

Primary Examiner—Scott B. Geyer
(74) Attorney, Agent, or Firm—Mayer, Brown, Rowe and Maw LLP

(57) ABSTRACT

The present invention provides a method of fabricating a capacitor for a semiconductor device. The method includes: forming sequentially a lower electrode and a dielectric layer having a high dielectric constant over a semiconductor substrate which have gone through predetermined processes; forming sequentially a first metal layer and a poly-silicon layer over the dielectric layer; forming an upper electrode pattern by pattering the poly-silicon layer and the first metal layer; forming a second metal layer covering the upper electrode pattern on an entire surface of the semiconductor substrate; and forming an upper electrode constituted with the second metal layer, the poly-silicon layer and the first metal layer by patterning the second metal layer so that the second metal layer is connected with the first metal layer.

18 Claims, 4 Drawing Sheets

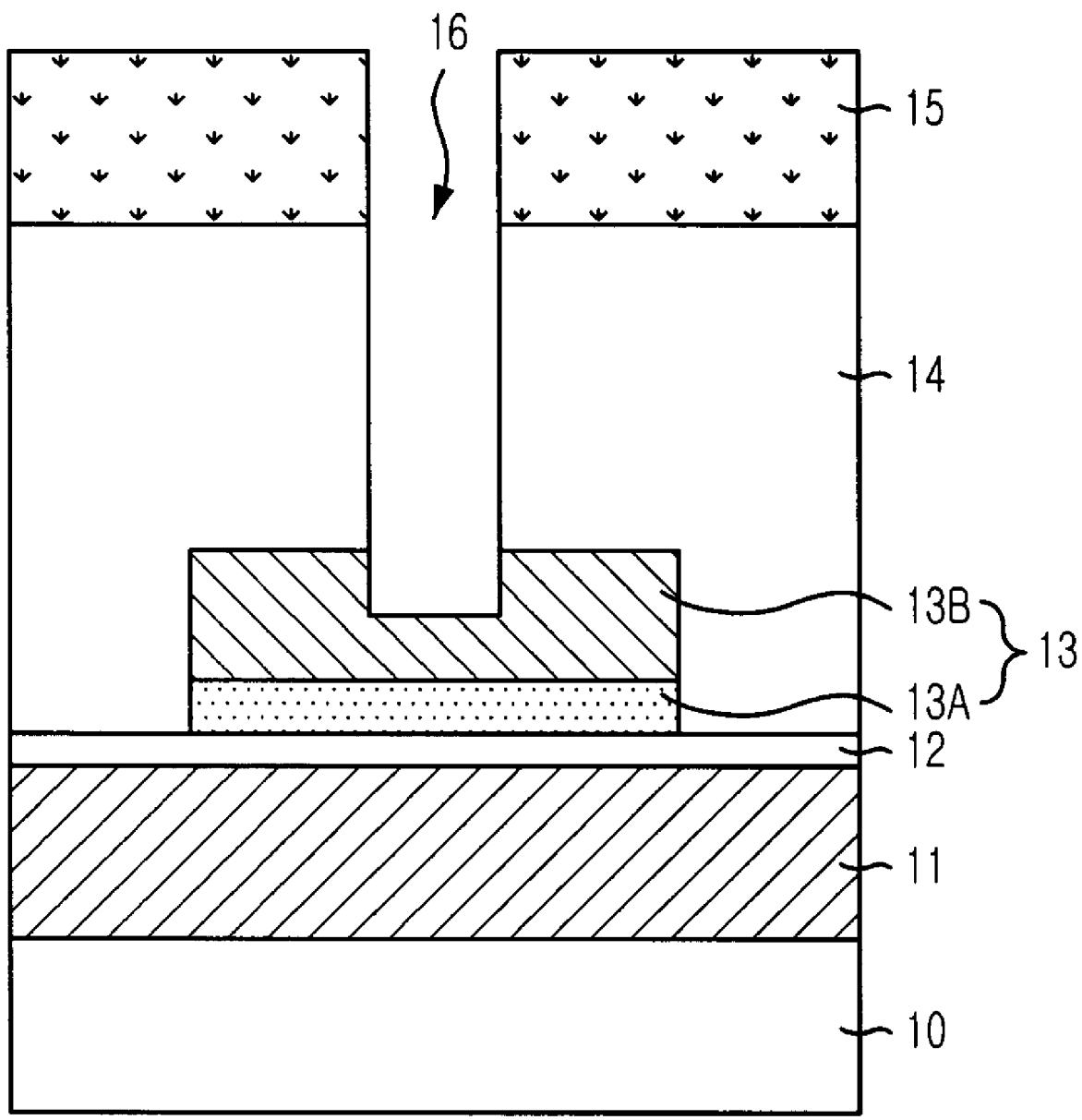

METHOD FOR FABRICATING CAPACITOR OF SEMICONDUCTOR DEVICE

FIELD OF THE INVENTION

The present invention relates to a capacitor of a semiconductor device; and, more specifically, to a method for fabricating the same with a low contact resistance between an upper electrode and an electric line.

DESCRIPTION OF RELATED ARTS

A capacitor used for a memory cell is constituted with a lower electrode, a dielectric layer and an upper electrode for a plate. Usually, a single poly-silicon layer is used for the lower electrode and the upper electrode, and an oxide-nitride-oxide (ONO) layer is used for a material constituting the dielectric layer, and thus, a silicon-insulator-silicon (SIS) structure is formed. However, with the SIS structure, it is impossible to obtain a capacitance satisfactorily applied to a semiconductor device having a reduced cell area resulted from large scale integration.

Accordingly, a ferroelectric layer such as a tantalum oxide ($Ta_2O_5$) layer, a titanium oxide ($TiO_2$) layer, an aluminum oxide-tantalum oxide ($Al_2O_3$—$Ta_2O_5$) double layer, a strontium titanium oxide ($SrTiO_3$), or a piezoelectric translator (PZT) layer is recently used to increase the capacitance of the dielectric layer instead of the ONO layer. In case of applying the dielectric layer having a high dielectric constant to the semiconductor device, a silicon oxide ($SiO_2$) layer having a low dielectric constant is formed at an interface between the dielectric layer and the upper electrode by a succeeding heat treatment process, and therefore, the capacitance of the dielectric layer is degraded. To solve the drawback, a metal layer such as a titanium nitride (TiN) layer having a superior thermal stability as well as a good step-coverage and a poly-silicon layer capable of serving as a buffer are sequentially formed to obtain the upper electrode.

FIG. 1 is a cross-sectional view showing a semiconductor device in accordance with a prior art. A method for fabricating the semiconductor device is explained with reference to FIG. 1.

A lower electrode 11 made with the poly-silicon layer is formed on the semiconductor substrate 10 which have gone through predetermined processes for forming a transistor, a bit line and a storage node contact. In addition, a dielectric layer 12 constituted with the aforementioned ferroelectric layer is formed on the lower electrode 11. Next, the TiN layer 13A and the poly-silicon layer 13B are sequentially deposited on a top area of the dielectric layer 12 and patterned to form an upper electrode 13. An inter-layer insulation film 14 is formed on an entire surface of the semiconductor substrate 10. A photo-resist pattern is formed on the inter layer insulation film 14 by carrying out a photo-lithography process, and the inter-layer insulation film 14 is etched with use of the photo-resist pattern as a mask to thereby form a contact hole 16 exposing a portion of the upper electrode 13.

The lowest contact resistance of an electric line formed through a succeeding process can be obtained by using the TiN layer 13A having a low sheet resistance. Herein, the TiN 13A on the upper electrode 13 is exposed during the etching process with the upper electrode 13 for forming the contact hole 16. However, the TiN layer 13A does not serve as an etch barrier because a strong film stress exists in the TiN 13A layer, and therefore, only the thin TiN 13A layer can be formed. After etching the inter-layer insulation film 14 for forming the contact hole 16, the poly-silicon layer 13B is exposed over most of the area as shown in FIG. 1, or the TiN layer 13A is penetrated even if not illustrated. The former brings into increasing the contact resistance between the poly-silicon layer 13B and the electric line because the sheet resistance of the poly-silicon layer 13B is much higher than that of the TiN layer 13A, and in case of the latter, an under-short phenomenon could take place. In addition, a variation of the contact resistance becomes pronounced because both of the cases can be found on an wafer.

SUMMARY OF THE INVENTION

It is, therefore, an object of the present invention to provide a method for fabricating a capacitor of a semiconductor device, wherein a variation of a contact resistance between an upper electrode and an electric line is minimized by using the capacitor. In addition, a low contact resistance is also obtained by using the same.

In accordance with an aspect of the present invention, there is provided the method for fabricating a capacitor of the semiconductor device, including: forming sequentially a lower electrode and a dielectric layer having a high dielectric constant over a semiconductor substrate which have gone through predetermined processes; forming sequentially a first metal layer and a poly-silicon layer over the dielectric layer; forming an upper electrode pattern by pattering the poly-silicon layer and the first metal layer; forming a second metal layer covering the upper electrode pattern on an entire surface of the semiconductor substrate; and forming an upper electrode constituted with the second metal layer, the poly-silicon layer and the first metal layer by patterning the second metal layer so that the second metal layer is connected with the first metal layer.

BRIEF DESCRIPTION OF THE DRAWINGS

Other objects and aspects of the invention will become apparent from the following description of the embodiments with reference to the accompanying drawings, in which:

FIG. 1 is a cross-sectional view showing a method for fabricating a capacitor of a semiconductor device in accordance with a prior art.

DETAILED DESCRIPTION OF THE PREFERRED EMBODIMENTS

Hereinafter, an inventive method for fabricating a capacitor of a semiconductor device will be described in detail referring to the accompanying drawings. Particularly, a variation of a contact resistance between an upper electrode and an electric line is minimized by using the capacitor. In addition, a low contact resistance is also obtained by using the same.

FIGS. 2A to 2E are cross-sectional views for explaining the method for fabricating the capacitor of the semiconductor device in accordance with a preferred embodiment of the present invention.

Figure 2A:
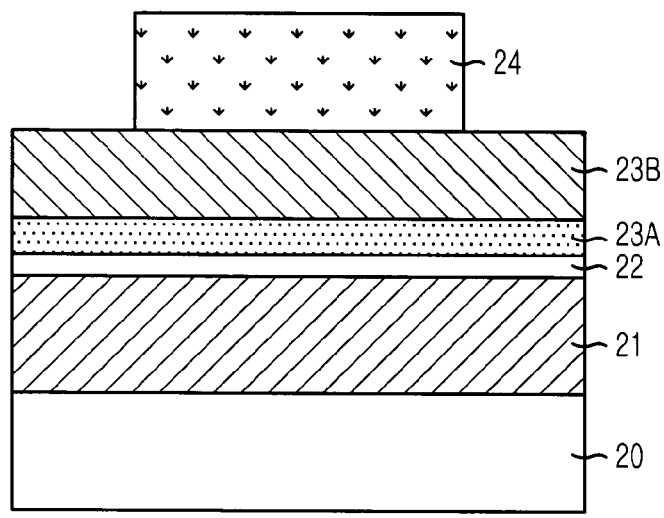
FIGS. 2A to 2E are cross-sectional views showing a method for fabricating a capacitor of a semiconductor device in accordance with the present invention.

Referring to FIG. 2A, a lower electrode 21 made with a poly-silicon layer is formed over a semiconductor substrate 20 which have gone through predetermined processes for forming a transistor, a bit line and a storage node contact, and a dielectric layer 22 is formed over the lower electrode 22 by using a ferroelectric layer such as a tantalum oxide ($Ta_2O_5$) layer, a titanium oxide ($TiO_2$) layer, an aluminum oxide ($Al_2O_3$)-tantalum oxide ($Ta_2O_5$) double layer, strontium titanium oxide ($SrTiO_3$) layer or a piezoelectric translator (PZT) layer. A titanium nitride (TiN) layer 23A used for a first metal layer is then formed over the dielectric layer 22 by carrying out a chemical vapor deposition (CVD) process and a poly-silicon layer 23B serving as a buffer is formed on a top area of the TiN layer 23A. Herein, the TiN layer 23A has a thickness ranging from about 100 Å to about 500 Å, and the poly-silicon layer 23B has a thickness ranging from about 300 Å to about 2500 Å. Next, a first photo-resist pattern 24 is formed on the top area of the poly-silicon layer 23B by carrying out a photo-lithography process.

Figure 2B:
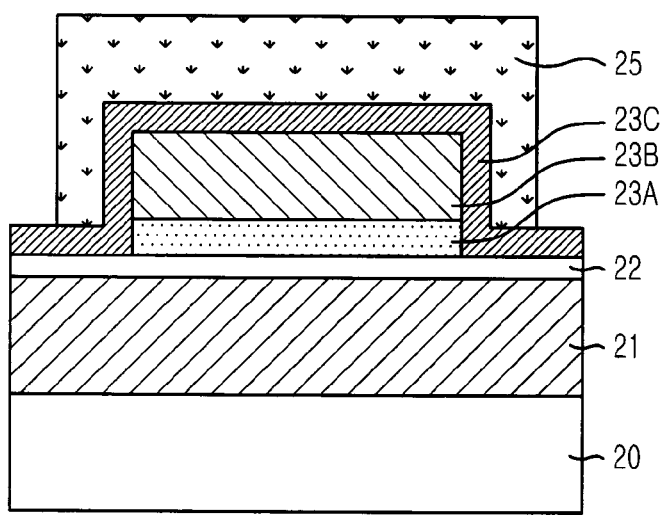

Referring to FIG. 2B, an upper electrode pattern is formed by etching the poly-silicon layer 23B and the TiN layer 23A. At this time, the first photo-resist pattern 24 is used as a mask for etching the poly-silicon layer 23B and the TiN layer 23A. A second metal layer 23C having a good electric conductivity is formed over an entire surface of the semiconductor substrate 20 in order to cover the upper electrode pattern after removing the first photo-resist pattern. Usually, the second metal layer 23C is formed by using one of such layers as a TiN layer, a titanium (Ti) layer, a tungsten (W) layer, and an aluminum (Al) layer. Herein a thickness of the second metal layer 23C ranges from about 100 Å to about 1000 Å. A second photo-resist pattern 25 is formed on the second metal layer 23C. Specifically, it is noted that an overall size of the second photo-resist pattern 25 is bigger than that of the first photo-resist pattern 24.

Figure 2C:
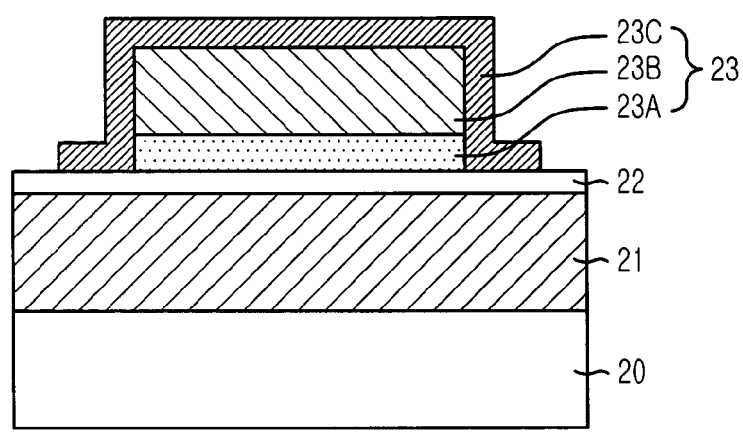

Referring to FIG. 2C, an upper electrode 23 constituted with the second metal layer 23C, the poly-silicon layer 23B and the TiN layer 23A is formed by etching the second metal layer 23C. At this time, the second photo-resist pattern 25 is used as a mask for etching the second metal layer 23C, and the second metal layer 23C makes a contact to the TiN layer 23A and both of them are electrically connected with each other. The second photo-resist pattern 25 is then removed.

Figure 2D:
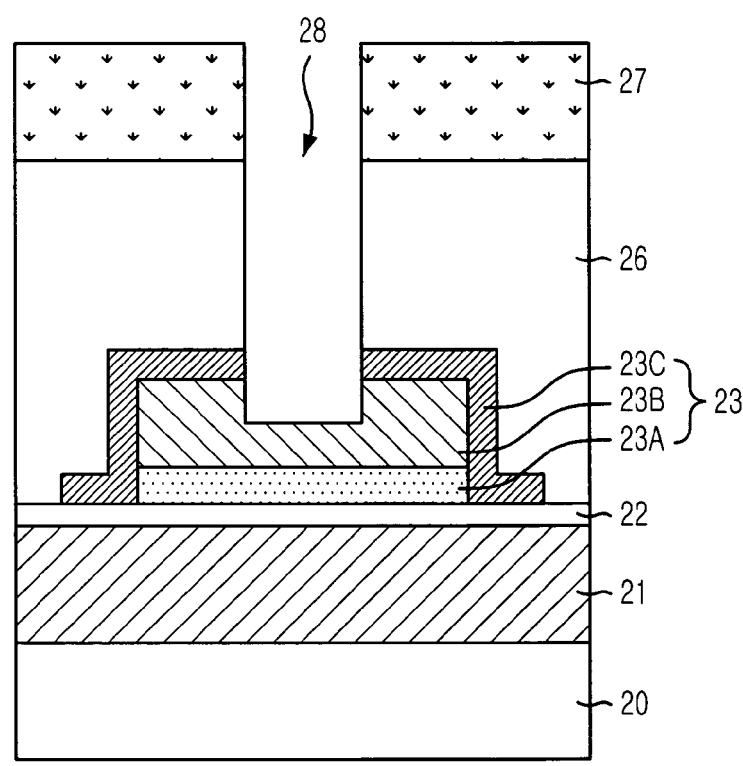

Referring to FIG. 2D, an inter-layer insulation film 26 is formed on an entire surface of the semiconductor substrate, and a third photo-resist pattern 27 is formed over the inter-layer insulation film 26 by performing a photo-lithography process. Next, a contact hole 28 exposing a portion of the upper electrode 23 is formed through an etch of the inter-layer insulation film 26, wherein the third photo-resist pattern 27 is used as a mask for etching the inter-layer insulation film 26. At this time, despite that the poly-silicon layer 23B is exposed and thereby an electric current flows into the TiN layer 23A through the second metal layer 23C, a low contact resistance between the upper electrode 23 and an electric line which will be formed by a succeeding process can be obtained because of the TiN layer 23A connected with the second metal layer 23C having a superior conductivity. In addition, even if not illustrated in FIG. 2D, the low contact resistance can be secured although the TiN layer 23A or the second metal layer 23C is exposed. The reason for the result is because those TiN, poly-silicon and second metal layers 23A, 23B and 23C constituting the upper electrode 23 have a low sheet resistance. Furthermore, even if the poly-silicon layer 23B penetrates through the TiN layer 23A, the low contact resistance is secured because the electric current flows through the second metal layer 23C having the superior conductivity.

Figure 2E:
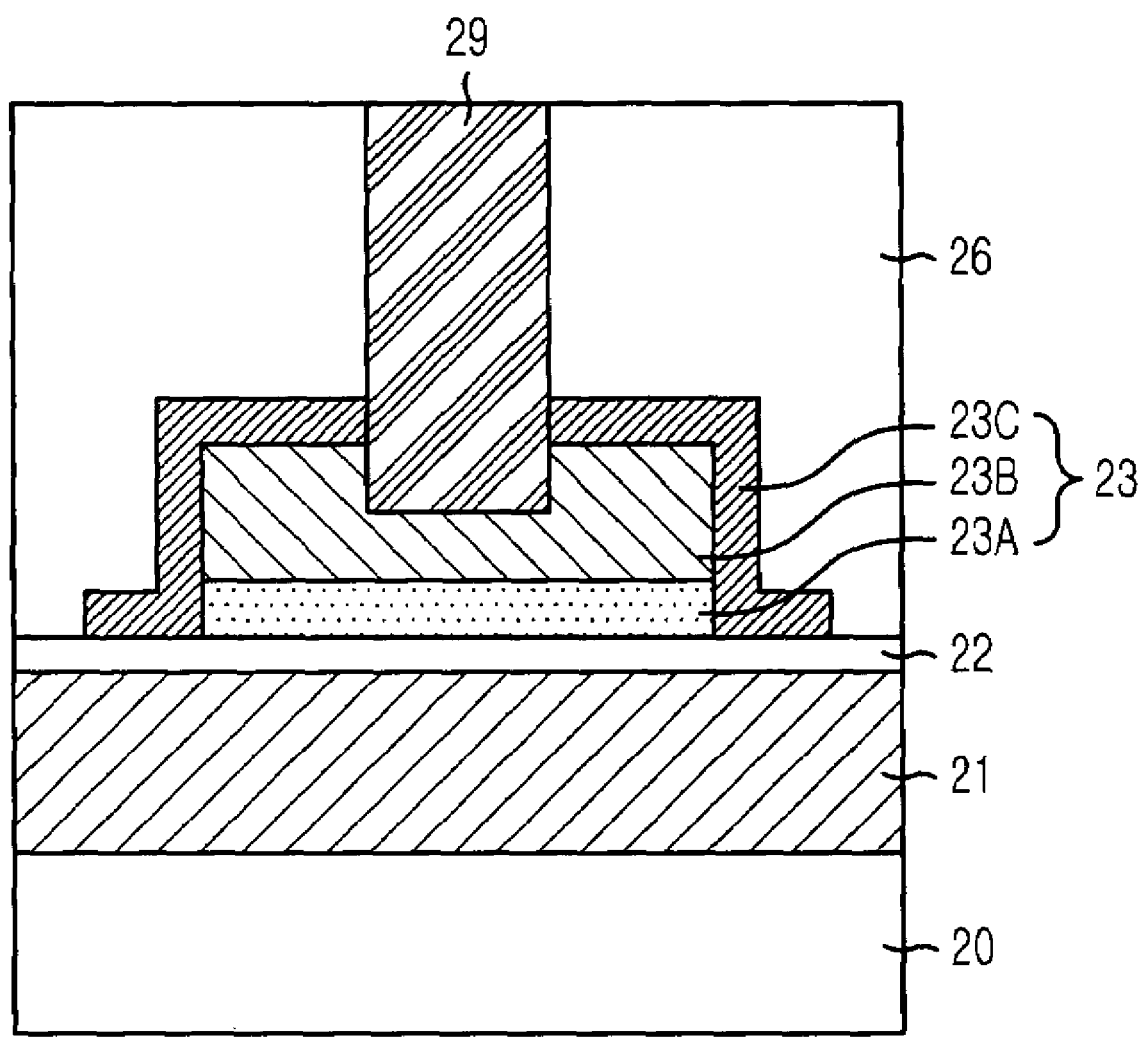

Referring to FIG. 2E, the third photo-resist pattern 27 is removed, and a tungsten (W) layer used for a metal layer is deposited and buried into the contact hole 28. Herein, the tungsten (W) layer acts as a plug 29 on the inter-layer insulation film 26. Next, the plug 29 contacted with the upper electrode 23 is formed by performing a blanket etching process for the tungsten (W) layer. At this time, an etch-back process or a chemical mechanical polishing (CMP) process is employed for the blanket etching process.

In conclusion, according to the present invention, the low contact resistance between the upper electrode 23 and the electric line is secured by connecting the metal layer 23C having the superior electric conductivity with the TiN layer 23A. In addition, although an etching process is carried out until any layer constituting the upper electrode is etched away, the electric current flows easily through the metal layer having the superior electric conductivity. Accordingly, the variation of the contact resistance measured throughout an wafer is minimized.

While the present invention has been shown and described with respect to the particular embodiments, it will be apparent to those skilled in the art that many changes and modification may be made without departing from the spirit and scope of the invention as defined in the appended claims.

What is claimed is:

1. A method for fabricating a capacitor of a semiconductor device, comprising the steps of:
    forming sequentially a lower electrode and a dielectric layer having a high dielectric constant on a semiconductor substrate which has gone through predetermined processes;
    forming a first metal layer as a type of flat board on the dielectric layer;
    forming a poly-silicon layer on the first metal layer;
    patterning the poly-silicon layer and the first metal layer;
    forming a second metal layer covering the patterned poly-silicon layer and first metal layer and the semiconductor substrate, wherein a side wall of the patterned first metal layer is electrically connected to the second metal layer such that the patterned poly-silicon layer is surrounded by the patterned first metal layer and the patterned second metal layer; and
    patterning the second metal layer to thereby form an upper electrode constituted with the patterned second metal layer, the patterned poly-silicon layer, and the patterned first metal layer.

2. The method as recited in claim 1, wherein a titanium nitride (TiN) layer is used for forming the first metal layer.

3. The method as recited in claim 2, wherein the TiN layer is formed by performing a chemical vapor deposition (CVD) process.

4. The method as recited in claim 3, wherein a thickness of the TiN layer ranges from about 100 Å to about 500 Å.

5. The method as recited in claim 1, wherein the second metal layer is constituted with one of a titanium nitride (TiN) layer, a titanium (Ti) layer, a tungsten (W) layer and an aluminum (Al) layer.

6. The method as recited in claim 5, wherein a thickness of the second metal layer ranges from about 100 Å to about 1000 Å.

7. The method as recited in claim 1, wherein a thickness of the poly-silicon layer ranges from about 300 Å to about 2500 Å.

8. The method as recited in claim 1, wherein the dielectric layer is constituted with one of a tantalum oxide ($Ta_2O_5$) layer, a titanium oxide ($TiO_2$) layer, an aluminum oxide ($Al_2O_3$)-tantalum oxide ($Ta_2O_5$) double layer, strontium titanium oxide (SrTiO₃) layer and a piezoelectric translator (PZT) layer.

9. The method as recited in claim 1, further comprising the steps of:
forming an inter-layer insulation film on the semiconductor substrate after forming the upper electrode; and
forming a contact hole exposing a portion of the upper electrode by etching the inter-layer insulation film.

10. A method for fabricating a capacitor of a semiconductor device, comprising the steps of:
forming sequentially a lower electrode and a dielectric layer having a high dielectric constant on a semiconductor substrate;
forming a first metal layer as a type of flat board on the dielectric layer;
forming a poly-silicon layer on the first metal layer;
patterning the poly-silicon layer and the first metal layer;
forming a second metal layer covering the patterned poly-silicon layer and first metal layer and the semiconductor substrate, wherein a side wall of the patterned first metal layer is electrically connected to the second metal layer such that the patterned poly-silicon layer is surrounded by the patterned first metal layer and the patterned second metal layer; and
patterning the second metal layer to form an upper electrode consists of the patterned second metal layer, the patterned poly-silicon layer and the patterned first metal layer.

11. The method as recited in claim 10, wherein a titanium nitride (TiN) layer is used for forming the first metal layer.

12. The method as recited in claim 11, wherein the TiN layer is formed by performing a chemical vapor deposition (CVD) process.

13. The method as recited in claim 12, wherein a thickness of the TiN layer ranges from about 100 Å to about 500 Å.

14. The method as recited in claim 10, wherein the second metal layer is constituted with one of a titanium nitride (TIN) layer, a titanium (Ti) layer, a tungsten (W) layer and an aluminum (Al) layer.

15. The method as recited in claim 14, wherein a thickness of the second metal layer ranges from about 100 Å to about 1000 Å.

16. The method as recited in claim 10, wherein a thickness of the poly-silicon layer ranges from about 300 Å to about 2500 Å.

17. The method as recited in claim 10, wherein the dielectric layer is constituted with one of a tantalum oxide ($Ta_2O_5$) layer, a titanium oxide ($TiO_2$) layer, an aluminum oxide ($Al_2O_3$)-tantalum oxide ($Ta_2O_5$) double layer, strontium titanium oxide ($SrTiO_3$) layer and a piezoelectric translator (PZT) layer.

18. The method as recited in claim 10, further comprising the steps of:
forming an inter-layer insulation film on the semiconductor substrate after forming the upper electrode; and
forming a contact hole exposing a portion of the upper electrode by etching the inter-layer insulation film.

* * * * *